United States Patent [19]

Ono et al.

[11] Patent Number: 4,719,541

[45] Date of Patent: Jan. 12, 1988

[54] ELECTRONIC APPARATUS MOUNTING STRUCTURE

[75] Inventors: Izumi Ono, Hachioji; Haruo Takayama, Sagamihara; Yasuo Takahashi; Eichiro Okumura, both of Kawasaki, all of Japan

[73] Assignee: Fujitsu Limited, Kawasaki, Japan

[21] Appl. No.: 924,847

[22] PCT Filed: Feb. 12, 1986

[86] PCT No.: PCT/JP86/00057

§ 371 Date: Oct. 10, 1986

§ 102(e) Date: Oct. 10, 1986

[87] PCT Pub. No.: WO86/05061

PCT Pub. Date: Aug. 28, 1986

[30] Foreign Application Priority Data

Feb. 13, 1985 [JP] Japan ................. 60-025611
Feb. 13, 1985 [JP] Japan ................. 60-025612

[51] Int. Cl.⁴ .................... H05K 7/20; H02B 1/20
[52] U.S. Cl. .................... 361/407; 361/384
[58] Field of Search .......... 307/147; 363/141; 361/383, 384, 407, 413, 392, 395, 334, 414; 174/70 B, 72 B

[56] References Cited

U.S. PATENT DOCUMENTS 3,125,628  3/1964  Fisher ................. 307/147
4,365,288 12/1982  Robe .................. 363/141
4,401,844  8/1983  Fleuret ............... 361/407

FOREIGN PATENT DOCUMENTS 47621  3/1984  Japan ................. 361/407
60-200596  of 1985  Japan .

Primary Examiner—G. P. Tolin
Attorney, Agent, or Firm—Staas & Halsey

[57] ABSTRACT

The present invention relates to a mounting structure for electronic apparatus mounting electronic parts with a high mounting density. The present invention is capable of supplying power to a printed wiring board from a power supply without a voltage drop through a very short wiring distance. Both the power supply and printed wiring board are cooled with a common air cooling fan, and the power supply, bus plate and printed wiring board are integrally assembled and connected.

7 Claims, 6 Drawing Figures

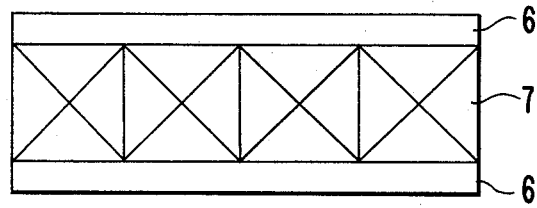
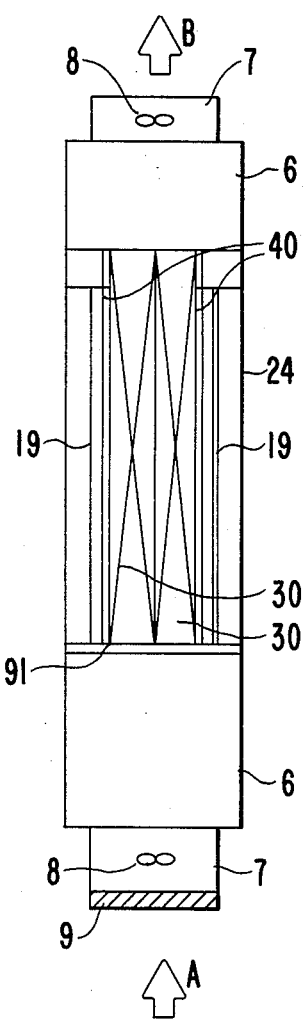
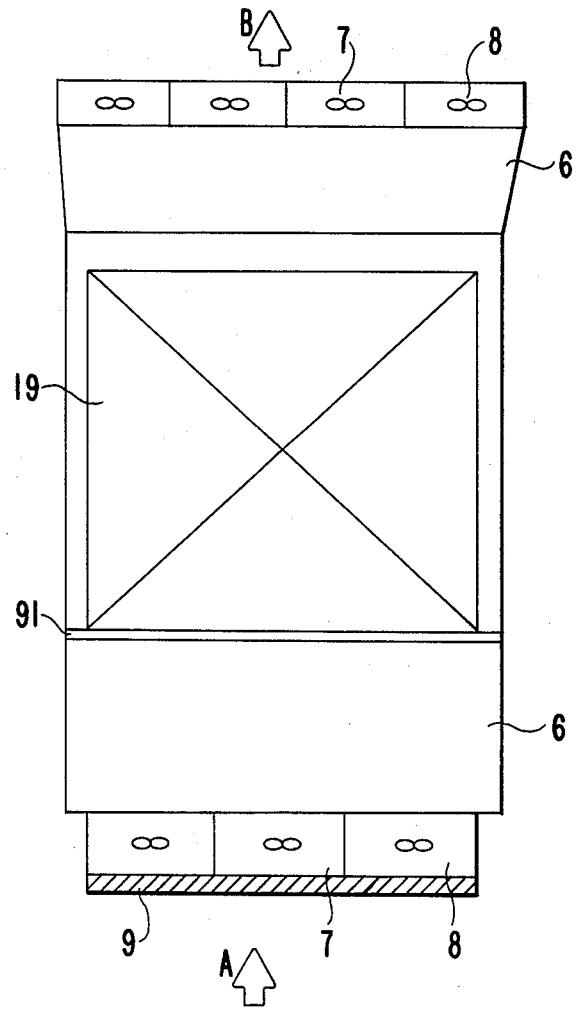

ELECTRONIC APPARATUS MOUNTING STRUCTURE

BACKGROUND OF THE INVENTION

The present invention relates to a mounting structure including a power supply structure between a power supply and an electronic apparatus such as printed wiring board and a cooling structure to be used for electronic apparatus such as a computer system, and particularly to a power supply structure which is so structured that the power is supplied through a bath plate having a plurality of conductive layers and a mounting structure which is suitable for air cooling by a fan.

An electronic apparatus such as electronic computer system is structured as shown in the side elevation of FIG. 3.

An electronic apparatus 5 is housed in an enclosure 1 which is provided with a door 2 to be opened or closed. Moreover, the housed electronic apparatus 5 is provided with a fan unit 7 and a duct 6 and the electronic apparatus 5 is cooled by air by driving the fan 8.

At the bottom part of enclosure 1, the legs 3 for supporting the enclosure 1 from the floor surface and the casters 4 for transferring the enclosure 1 along the floor surface are further provided.

Such recent electronic apparatus 5 is formed as a semiconductor element such as an LSI which assures high packing density and high speed operations, a one-board substrate on which an electronic circuit is formed by mounting circuit elements on a single multilayered printed wiring board, and a power supply which supplies specified power to said one board substrate.

In the case of such electronic apparatus, the power source supplied to the one board substrate from the power supply has a low drop of voltage through the bus because it is shortened as much as possible and it is also necessary that the cooling efficiency must be high because the one board substrate generates a large amount of heat.

Accordingly, it is generally important for such electronic apparatus that the structure thereof can be formed in compactly without causing any problem in the air cooling system.

The structure of electronic apparatus of prior art has been formed as indicated in the perspective view of FIG. 4.

A unit 10 formed using a one board substrate 19 engaged with the one or both surfaces of a bus plate 13 through the posts 14 and a power supply unit 18 provided with the output terminals 18A, 18B are arranged together. The bus plate 13 is composed of a conductive layer 11, which is provided with mounting holes 11A for mounting on an enclosure frame and is connected to the earth, and conductive layers 12 which are layered on both sides of conductive layer 11 in order to hold it through the insulation materials and are connected to the specified power source voltage.

Moreover, the posts 14 fixed respectively to the conductive layer 11 or conductive layer 12 of bus plate 13 are conductively connected to the predetermined land of the one board substrate 19 with a screw 15 screwed to the threaded hole provided at the end portion of post 14 through the fitting hole of the one board substrate 19.

This post 14 is formed by a flexible conductive material and it should desirably to extensive and compressive. (For details, refer to the Japanese Patent Application No. 59-111280.)

Power supply bars 16, 17 are extended between the bus plate 13 and power supply unit 18, the conductive layer 11 is connected to the power supply bar 16 while the conductive layer 12 is connected to the power supply bar 17 respectively by screwing a bolt 21 to the bus plate 13. Moreover, the power supply bar 16 is connected to the output terminal 18A while the power supply bar 17 to the output terminal 18B respectively by screwing the bolts 20, and the power sources from the output terminals 18A, 18B of power supply unit 18 are supplied to the one board substrate 19 through the bus plate 13 and post 14.

Cooling can be done in such a way that the surface B of one board substrate 19 is cooled by ventilation in the direction of arrow mark D while the space A by ventilation in the direction of arrow mark C.

Such structure however has a problem that the power supply bus is longer and thereby the voltage drops because the power source of power supply unit 18 is supplied through the extended power supply bars 16 and 17.

In addition, when the unit 10 and power supply unit 18 forming the prescribed ventilation path are arranged only on the upper and lower sides or to the right and left sides or to the forward and backward, respective ventilation resistances are different, ventilation within the enclosure 1 is unbalanced at the time of cooling and thereby the cooling efficiency is deteriorated. On the other hand, a problem in that a dead space is generated by a balanced co-arrangement resulting in the external appearance becoming large in size.

FIG. 5 is a detailed side elevation of the structure shown in FIG. 3. The unit 10 which is formed using the one board substrate 19, which is engaged with both sides of bus plate 13 through the post 14, an air cover 22 which covers the one board substrate 19 and a power supply unit 18 provided with the output terminals 18A, 18B are arranged together within the enclosure 1. Moreover, a duct 6 and a fan unit 7 are provided at the upper and lower end portions of the unit 10 and power supply unit 18.

Drive of the fans 8 takes the external air in the direction of arrow A from the bottom part 1B of the enclosure 1, exhausts in the direction of arrow mark B from the ceiling part 1A and cools the unit 10 and power supply unit 18.

In such a structure, since the power source of the power supply unit 13 is supplied by the extended power supply bars 16 and 17, the power supply path is long resulting in a voltage drop. Moreover, a dead space with internval S is created between the unit 10 and power supply unit 18 and only the external appearance of the enclosure 1 becomes large in size.

Moreover, the structure shown in FIG. 5 has also been a problem in the air cooling that because the unit 10, forming the one board substrate 19, and the power supply unit have different ventilation resistances, a part of the exhaust air is taken in the direction of arrow mark E during exhaustion from the ceiling part 1A as shown in FIG. 5 and high temperature air to be exhausted remains within the enclosure 1, lowering the cooling efficiency.

It is also a problem of the existing structure from the point of view of cost and mounting efficiency that a separating plate must be provided between the power supply 18 and the unit 10 or a duct which directly opens at least the one exhaust aperture to the external side of enclosure must be provided in order to adjust the migration of exhaust air and the balance in the amount of flowing air.

SUMMARY OF THE INVENTION

In the case of present invention, power supply output terminals are provided on predetermined surfaces of power supply unit, the connecting pieces matching said predetermined output terminals are formed respectively connected to the conductive layers of a bus plate, said power supply output terminals and said connecting pieces are pressurized and weld connected, and said bus plate is connected to the one board substrate through the post.

Such mounting structure is capable of preventing power supply voltage drop and unbalance and realizing very compact structure as a whole.

BRIEF DESCRIPTION OF DRAWINGS

FIG. 6 is a plan view (a), a front elevation view (b) and a side elevation view (c) of the mounting structure of the embodiment shown in FIG. 2.

DESCRIPTION OF THE PREFERRED EMBODIMENTS

Figure 1:
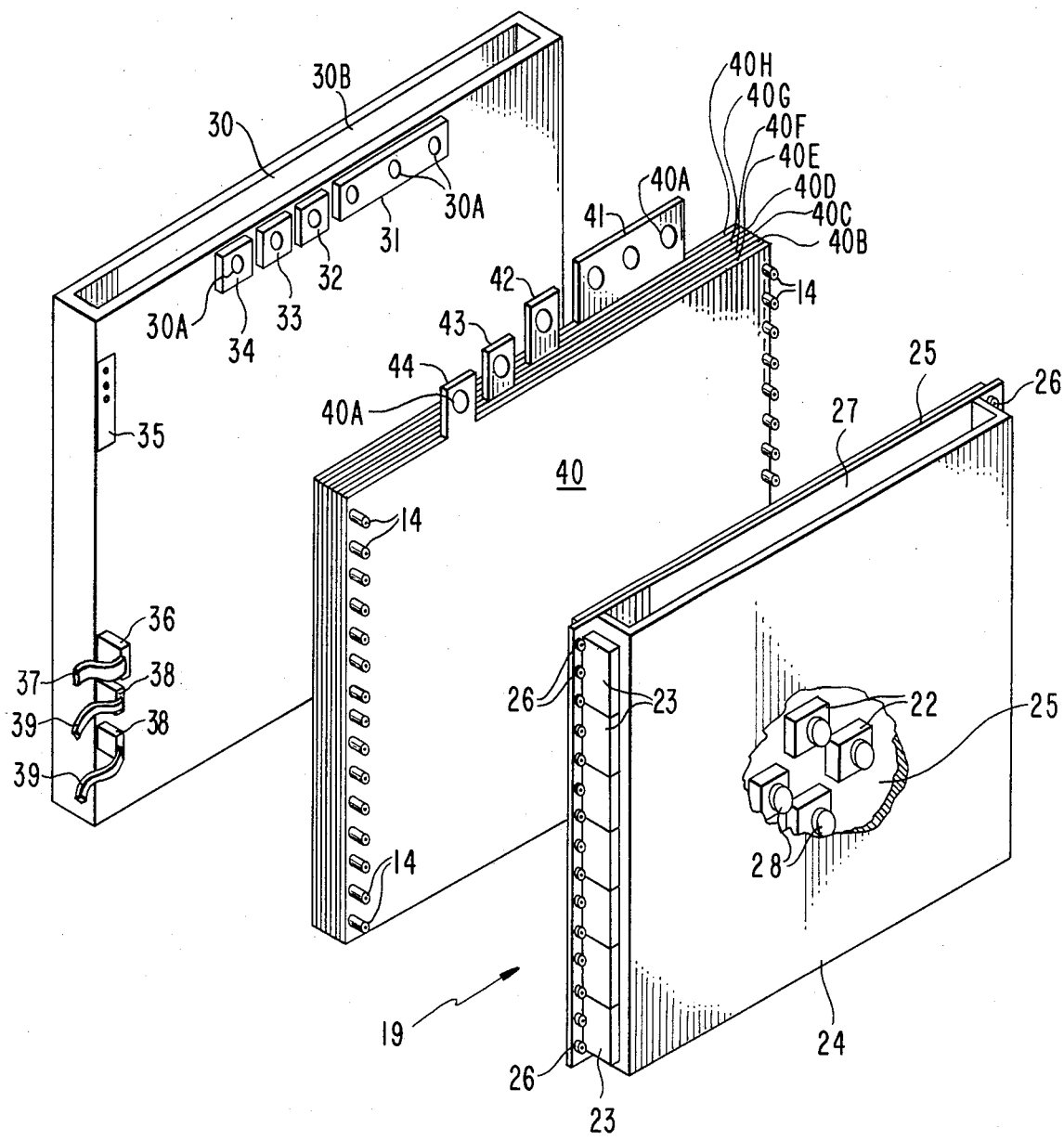
FIG. 1 is a perspective view of a disassembled embodiment of the present invention.
Figure 2A:
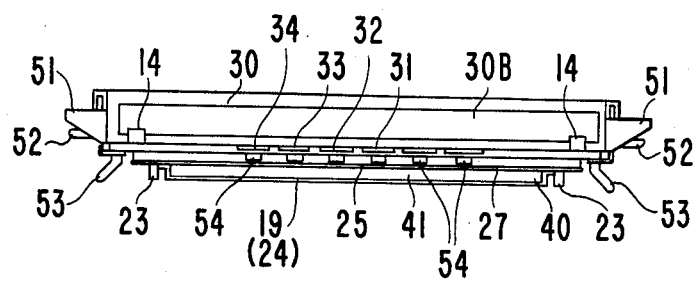
FIG. 2 is a detailed plan view (a), a front elevation view (b) and a side elevation view (c) of said embodiment.
Figure 2B:
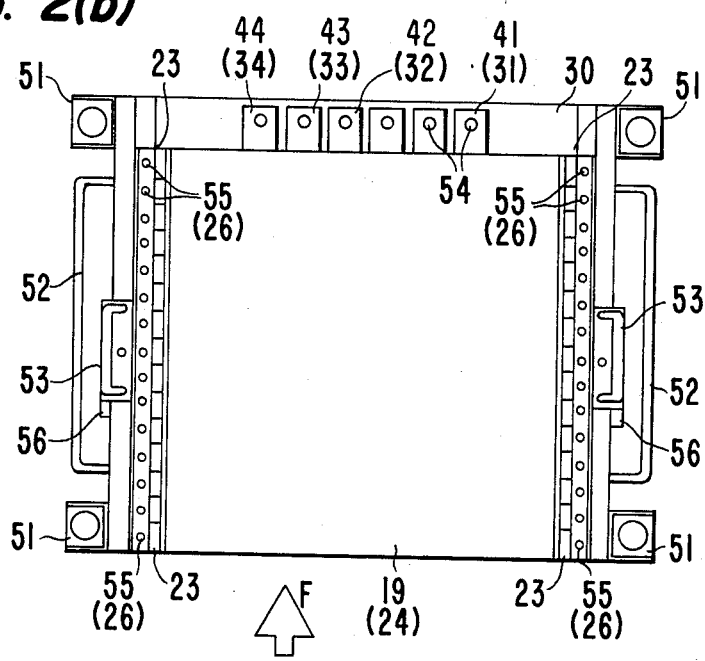
Figure 2C:
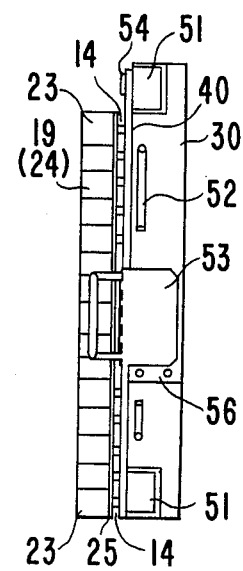

The present invention is explained in detail in accordance with an embodiment of FIG. 1 and FIG. 2. FIG. 1 is a perspective view of disassembled structure. FIG. 2(a) is a plan view of the detailed embodiment, (b) is a front elevation view and (c) is a side elevation view. The like elements are given the like symbols throughout the drawings.

As shown in FIG. 1, the power supply part 30 is formed at almost the same size as the one board substrate 19. The side wall thereof is provided with output terminals 31, 32, 33, 34 having a stepped relationship and the power source of power supply 30 is supplied to the one board substrate 19 through the posts 14 welded to the bus plate 40 when the output terminals 31, 32, 33, 34 are connected to the connecting pieces 41, 42, 43, 44 of the bus plate 40.

The bus plate 40 is a lamination of a plurality of conductive layers 40E, 40F, 40G, 40H and insulation layers 40B, 40C, 40D. The connecting pieces 41, 42, 43, 44 are respectively formed as the extrusions from or extensions of the conductive layers and moreover each respective conductive layer is provided with welded posts having high conductivity.

During construction the bus plate 40 is stacked on the side wall of power supply 30, a screw is tightened into the threaded hole 30A of the output terminals 31, 32, 33, 34 through the mounting hole 40A of the connecting pieces 41, 42, 43, 44. In addition, power is supplied to the one board substrate 19 by screwing a screw to said end portion after positioning said end portion of post 14 to the land 26 of the one board substrate 19. Accordingly, different power sources can be supplied by outputting different voltages, for example, "ground G", "+2 V" from the output terminals 31, 32, 33 and 34.

Such power supply 30 is required to be capable of displaying, for example, a ready or alarm condition through a display part 35 and capable of cooling the heat generating elements such as internal power transistors by providing apertures 30B at the upper and lower portions so that ventilation for air cooling is provided.

Furthermore, signals and main power source are input or output from the power supply 30 through the connectors 36, 38 and cables 37, 39.

The one board substrate 19 is formed by providing a cover 24 over a multilayered printed wiring board 25 mounting the electronic parts 22 such as semiconductor elements each having a heat radiation fin 28 and allowing input and output of signals through the connectors 23 provided at both ends of multilayered printed wiring board 25 (cables are not shown).

FIGS. 2(a), (b), (c) are details of assembled body with said structure. The corners of power supply 30 are provided with the metal 51 fixed at the time of housing into the enclosure 1 and both side surfaces are provided with the welded grips 52 for carrying and a guide 56 for connecting bus plate 40.

Both side surfaces of bus plate 40 are provided with the grip 53 having the guide surface which slides with the guide 56 mentioned above, the bus plate 40 is stacked on the power supply 30 and these are connected and fixed by fixing the connecting pieces 41, 42, 43, 44 to the output terminals 31, 32, 33, 34 with the screws 54. The one board substrate 19 is integrated to the bus plate 40 by screwing through the posts 14 and said integrated body is further preferably connected and fixed to the power supply 30 in order to integrate three elements.

The very effective cooling can be done by sending the air in the direction of arrow mark F. Namely, the air is circulated in the same direction through the aperture 30B for the power supply 30 and the space 27 between the multilayered printed wiring board 25 and the cover 24 for the one board substrate 19.

The connecting piece 41 of bus plate 40 is formed large in size as shown in FIG. 1 because it is set at the ground potential but it is desirable that such connecting piece is split into a plurality of connecting pieces 54 as shown in FIG. 2(b) in order to improve reliability of contact with the terminal 31 of power supply 30.

As described above, the power supply 30, bus plate 40 and one board substrate 19 are stacked and integrated in almost the same shape and thereby the power is supplied over the shortest path and total structure is compact.

The aperture 30B is also provided for the power supply 30 in the same shape as the ventilation path 27 of the one board substrate 19 and thereby amount of air provided both during the cooling can be easily matched.

FIG. 6 shows a mounting structure in the enclosure of electronic apparatus constituted as shown in FIG. 1 and FIG. 2. For improvement of mounting density, a pair of electronic apparatuses are arranged back to back and are cooled by a common fan 8.

Figure 3:
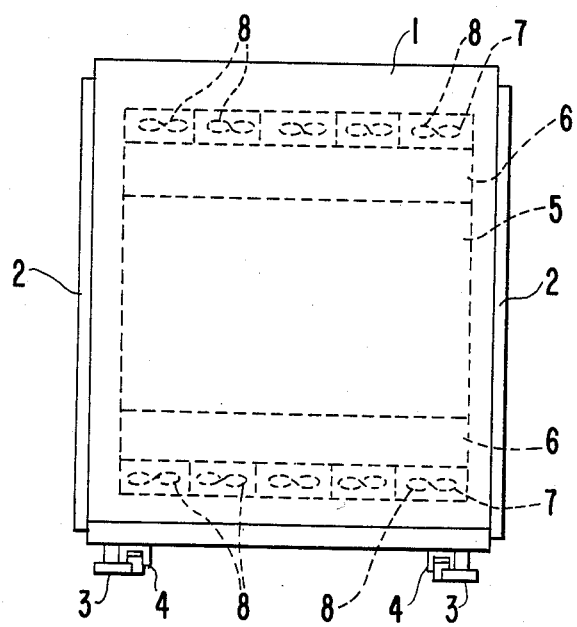
FIG. 3 is a side elevation of an ordinary electronic apparatus.
Figure 4:
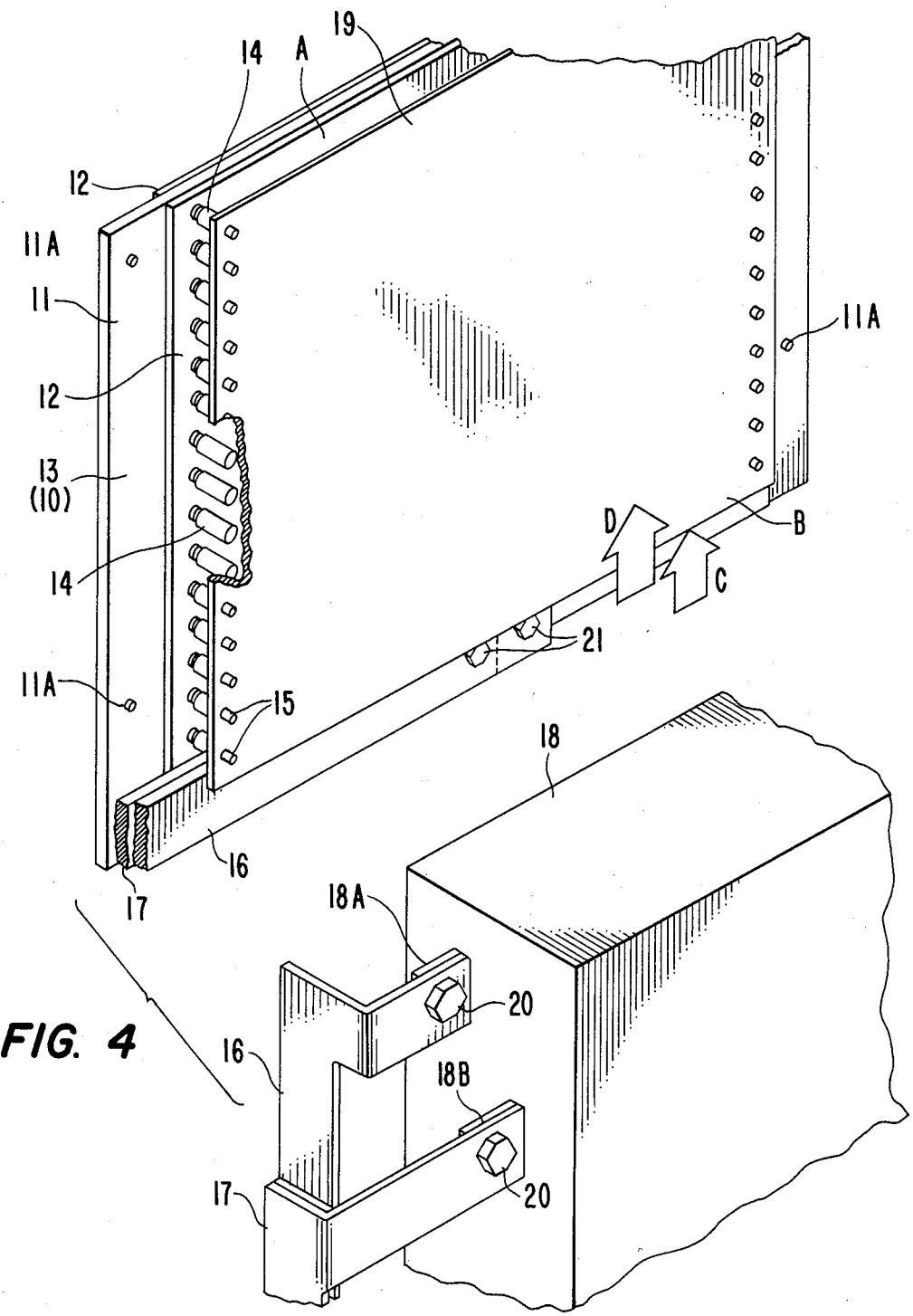
FIG. 4 is a perspective view of the principal portion of a prior art device.
Figure 5:
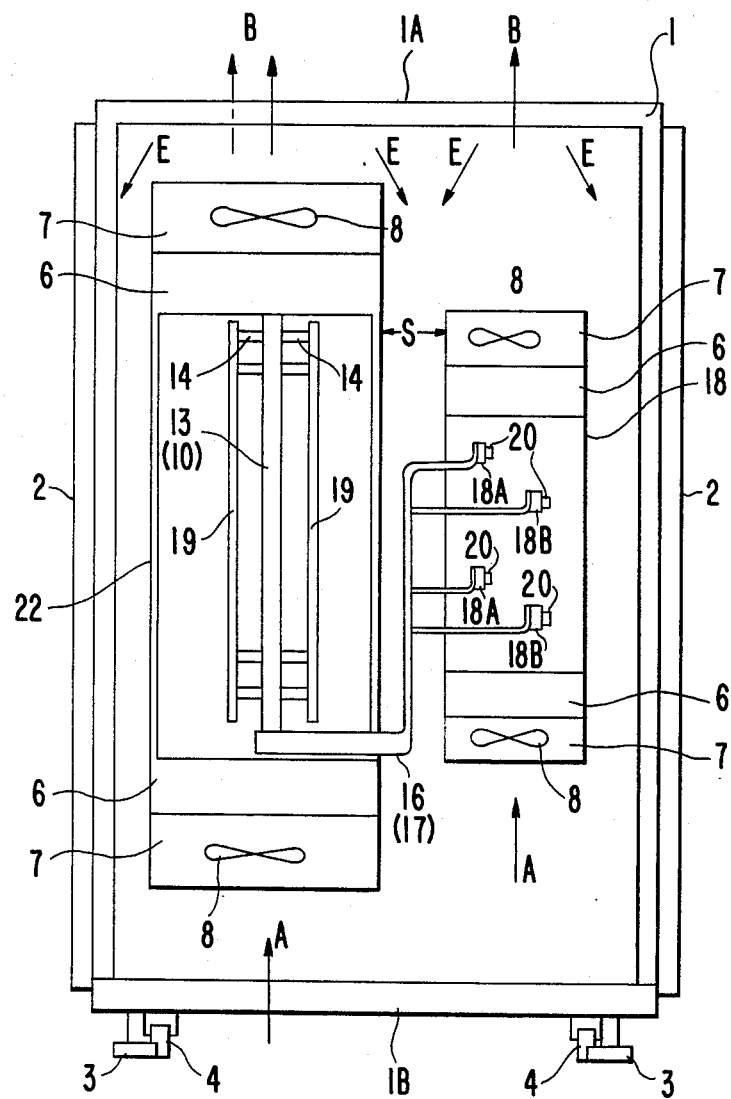
FIG. 5 is a detailed side elevation of FIG. 3.

FIG. 6(a) is a plan view, (b) is a front elevation view and (c) is a side elevation view. The same elements as those shown in FIG. 3 are given the same symbols.

As shown in FIG. 6, the power supplies 30 are arranged back to back, the one board substrate 19 is engaged with the surface where the bus plate 40 is welded, and moreover it is covered with an air cover 24, and the duct 6 and fan unit 7 are provided at the upper and lower portions.

When the fan 8 is driven, the air flows in the direction of arrow mark A through the filter 9 which filters the external air and an adjusting plate 91 which adjusts amount of air for ventilation. The air is exhausted in the direction of arrow mark B for the cooling by air. By cooling with air the pair of electronic apparatuses arranged back to back with a common fan unit, not only the mounting efficiency can be improved but also the balance in the amount of air supplied to both electronic apparatuses can be stabilized and the cables can also be extended easily from the connector 23.

The present invention can be widely applied with large effect as the mounting structure for electronic apparatus such as electronic computer and electronic switching equipment which is required to have a high mounting density and consumes comparatively a large power.

What is claimed is:

1. An electronic apparatus mounting structure, comprising:
   a bus plate including:
      a plurality of alternating conductive and insulation layers corresponding to a plurality of power supply voltages;
      a plurality of conducting posts weld connected to said conductive layers; and
      a plurality of connecting pieces formed at different relative positions and one piece from each conductive layer;
   a power supply including:
      a power supply circuit which supplies said plurality of power supply voltages; and
      a plurality of output terminals connected to the power supply circuit, formed at positions respectively corresponding to the plurality of connecting pieces and weld connected to the corresponding connecting pieces; and
   a printed wiring board holding electronic parts and having power supply lands weld connected at corresponding positions to the plurality of posts of said bus plate.

2. An electronic apparatus mounting structure as defined in claim 1, wherein:
   said printed wiring board mounts a plurality of electronic parts on at least one side
   said structure further comprising a cover mounted over said printed wiring board, which covers said mounted parts and forms an air cooling duct,
   said power supply further includes apertures at both end surfaces in the same direction as the air flowing path of the duct formed by said cover, and
   said structure further comprising a fan cooling both said printed wiring board and said power supply.

3. An electronic apparatus mounting structure as defined in claim 2, comprising:
   a pair of assembled units, each unit comprising said printed wiring board, bus plate and power supply, the power supply sides of each unit are arranged opposed to each other, and
   said air cooling fan is provided on at least one end of the air flowing paths of said pair of assembled units and whereby said pair of assembled units are air-cooled by the common cooling fan.

4. A mounting structure for electronic circuits, comprising:
   a power supply with stepped power terminals having a stepped relationship to each other;
   a bus plate including a lamination of insulation layers and conducting layers, each conducting layer having a connection extension matching and connected to a corresponding stepped power terminal; and
   a printed circuit board carrying electronic circuits and connected to the conducting layers.

5. A mounting structure as recited in claim 4, wherein said power supply has a first air flow channel therethrough, said bus plate is spaced apart from said power supply forming a second air flow channel and said bus plate is spaced apart from said printed circuit board forming a third air flow channel.

6. A mounting structure as recited in claim 5, further comprising a cover mounted over said printed circuit board forming a fourth air flow channel.

7. A mounting structure as recited in claim 6, further comprising a cooling fan blowing air through the first through fourth air flow channels.

* * * * *